US006620002B1

(12) United States Patent
Billman et al.

(10) Patent No.: US 6,620,002 B1
(45) Date of Patent: Sep. 16, 2003

(54) CONTACT STRIP FOR ELECTRICAL CONNECTOR

(75) Inventors: Timothy B. Billman, Dover, PA (US); Iosif R. Korsunsky, Harrisburg, PA (US)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 10/188,542

(22) Filed: Jul. 3, 2002

(51) Int. Cl.[7] ................................ H01L 13/02
(52) U.S. Cl. ................................ 439/885
(58) Field of Search ................................ 439/885, 631, 439/474, 637, 516

(56) References Cited

U.S. PATENT DOCUMENTS 4,395,087 A * 7/1983 Gorre et al. ................ 439/885
4,428,642 A * 1/1984 Schwindt et al. ........... 439/885
4,780,095 A 10/1988 Classon et al.
5,071,371 A 12/1991 Harwath et al.
5,152,700 A * 10/1992 Bogursky et al. ........... 439/885
5,860,821 A * 1/1999 Pernet ........................ 439/885
6,083,060 A * 7/2000 Chen et al. ................. 439/885
6,379,161 B1 * 4/2002 Ma ............................ 439/886

* cited by examiner

*Primary Examiner*—Tho D. Ta
*Assistant Examiner*—Felix O. Figueroa
(74) *Attorney, Agent, or Firm*—Wei Te Chung

(57) ABSTRACT

A contact strip (1) includes a number of contacts (10) interconnected by a carrier (60). Each contact includes a body portion (12), an upper arm (14) upwardly extending from the body portion for engaging with a first printed circuit board (5) and a lower arm (16) extending downwardly and laterally from the body portion. The lower arm has a free end (162) for resiliently engaging with a second printed circuit board (4) and a curved connecting portion (160) connecting with the body portion. The carrier has a connection stem (62) connecting with the curved connecting portion of the contact. An oblique score (15) is defined between the curved connecting portion of each contact and a corresponding connection stem of the carrier. The contacts can be easily separated from the carrier by bending the connection stems of the carrier along the oblique scores.

3 Claims, 5 Drawing Sheets

CONTACT STRIP FOR ELECTRICAL CONNECTOR

CROSS-REFERENCES TO RELATED APPLICATIONS

This patent application is an Application of patent application Ser. No. 10/152,540, entitled "CONTACT FOR ELECTRICAL CONNECTOR", invented by Timothy Brian Billman and Joanne Shipe and filed on May 20, 2002; and Ser. No. 10/154,318, entitled "HIGH DENSITY ELECTRICAL CONNECTOR", invented by Timothy Brain Billman and filed on May 22, 2002; both the applications are assigned to the same assignee with this application.

BACKGROUND OF THE INVENTION

1. Field of the Invention

The present invention relates to a contact strip for an electrical connector, and particularly to a contact strip with plural contacts thereon for resiliently contacting with a mother board and a daughter board that are oriented perpendicularly to each other, wherein the contact strip has an arrangement between a carrier of the strip and the contacts which can ensure that there is no remnant left on each contact when the carrier is separated from the contacts.

2. Description of Related Art

Electronic systems, such as computers, often employ electrical connectors to interconnect two electronic subsystems. To meet the trend of miniaturization of computer technology, the electrical connectors are developed to have a compact arrangement regarding contacts of the electrical connectors. The contacts are commonly stamped from a metal sheet and interconnected by a carrier. The carrier is then severed from the contacts after the contacts are completely inserted into a connector housing.

U.S. Pat. No. 5,071,371, assigned to Molex Incorporated, discloses a card edge connector having a contact strip. The connector comprises a connector housing defining a cavity and a plurality of slots therein, and a plurality of contacts received in the slots. Each contact includes a base interferentially received in the slot, a contact portion extending into the cavity for electrically engaging with a daughter board which is received in the cavity of the connector housing, and a tail extending beyond a mounting face of the connector housing for electrically connecting to a mother board via through hole technology. Therefore, an electrical connection is established between the mother board and the daughter board.

The contacts of the connector are stamped from conductive material and interconnected by a carrier to thereby form the contact strip. The tail of each contact is connected with the carrier. In assembly, the contacts are simultaneously inserted into the slots of the connector housing. The carrier is then severed from the contacts via a horizontal V-cut in the tail which is perpendicular to an extending direction of the tail. However, when the tails of the contacts are required to resiliently engage with the mother board, the V-cut design of this prior art is difficult in fulfilling the requirement of having smooth free ends for the tails.

U.S. Pat. No. 4,780,095, assigned to Digital Equipment Corporation, discloses a card edge connector having plural contacts and addresses to the problem encountered by the '371 patent. As shown in FIGS. 1–4 of the '095 patent, the contacts 14 are profiled out of a section of a flat stock. Each contact 14 includes a stabilizer plate 26 with a root section 28 positioned within a slotted root nesting area 30 of an insulator body 12, a daughter contact beam 36 upwardly extending from an intermediate location on the stabilizer plate 26 with a contact area 40 projecting into a board slot 20 for electrically engaging with an inserted daughter board. A surface pressure contact beam 32 extends downward from the stabilizer plate 26 and toward the root section 28. The surface pressure contact beam 32 has a curved portion (not labeled) connecting with the stabilizer plate 26 at a portion distal from the root section 28, and a surface pressure contact 34 at a free end thereof for resiliently contacting with a contact pad on a mother board.

Referring again to FIG. 4 of the '095 patent, during the stamping process, two adjacent contacts 14 are interconnected via a connecting portion (not labeled) between the curved portion of the contact 14 and the root section 28 of an adjacent contact 14. Subsequently, the contacts 14 can be excised from the flat stock at the connecting portions. However, the contact 14, which is severed from the flat stock, has a scrap (not labeled) left on the curved portion. The scrap may affect the flexibility of the surface pressure contact beam 32 of the contact. As a result, the electrical connection between the connector and the mother board may be unreliable.

Other related contact strips for electrical connectors are described in U.S. Pat. Nos. 6,379,161, 6,083,060, 5,860,821 and 4,428,642.

Hence, there is a need to have an improved contact strip which can solve the problem of the related art.

SUMMARY OF THE INVENTION

Accordingly, it is an object of the present invention to provide a contact strip wherein each contact separated therefrom has a good flexibility for ensuring a reliably compressive engagement between the contacts and a printed circuit board.

It is another object of the present invention to provide a contact strip with plural contacts thereon for compressively connecting with a printed circuit board wherein each contact is easily separated from a carrier of the contact strip and has no remnant left thereon when the contacts are separated from the carrier.

In order to achieve the objects set forth, a contact strip in accordance with the present invention includes a plurality of contacts interconnected by a carrier. Each contact includes a body portion, an upper arm upwardly extending from the body portion for engaging with a first printed circuit board and a lower arm extending downwardly and laterally from the body portion. The lower arm has a free end for resiliently engaging with a second printed circuit board and a connecting portion connecting with the body portion.

The carrier has a plurality of connection stems each connecting with the connecting portion of a corresponding contact. An oblique score is defined between the connecting portion of each contact and a corresponding connection stem of the carrier for facilitating removing the carrier from the contacts. There is no remnant left on the connecting portion of the lower arm when the contact is separated from the carrier, whereby the flexibility of the lower arm is ensured.

Other objects, advantages and novel features of the invention will become more apparent from the following detailed description when taken in conjunction with the accompanying drawings.

DETAILED DESCRIPTION OF THE INVENTION

Reference will now be made in detail to the preferred embodiment of the present invention.

Figure 1:
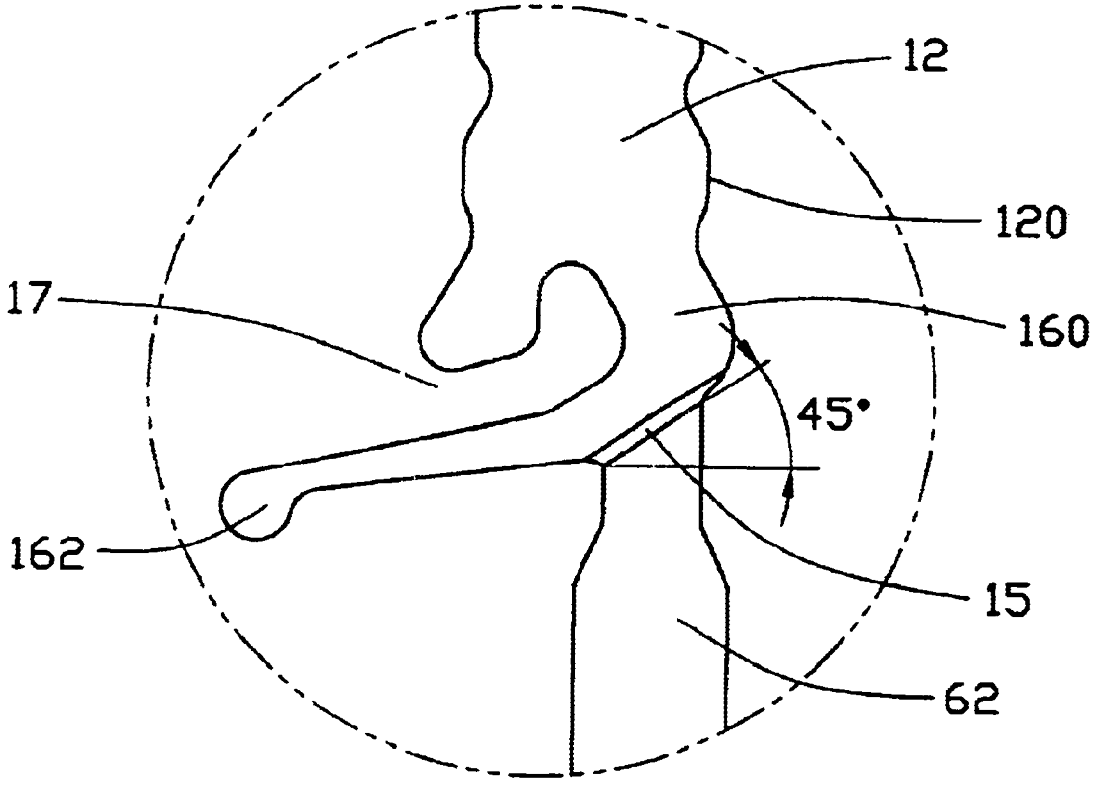
FIG. 1 is an enlarged view of a contact strip in accordance with the present invention.
Figure 2:
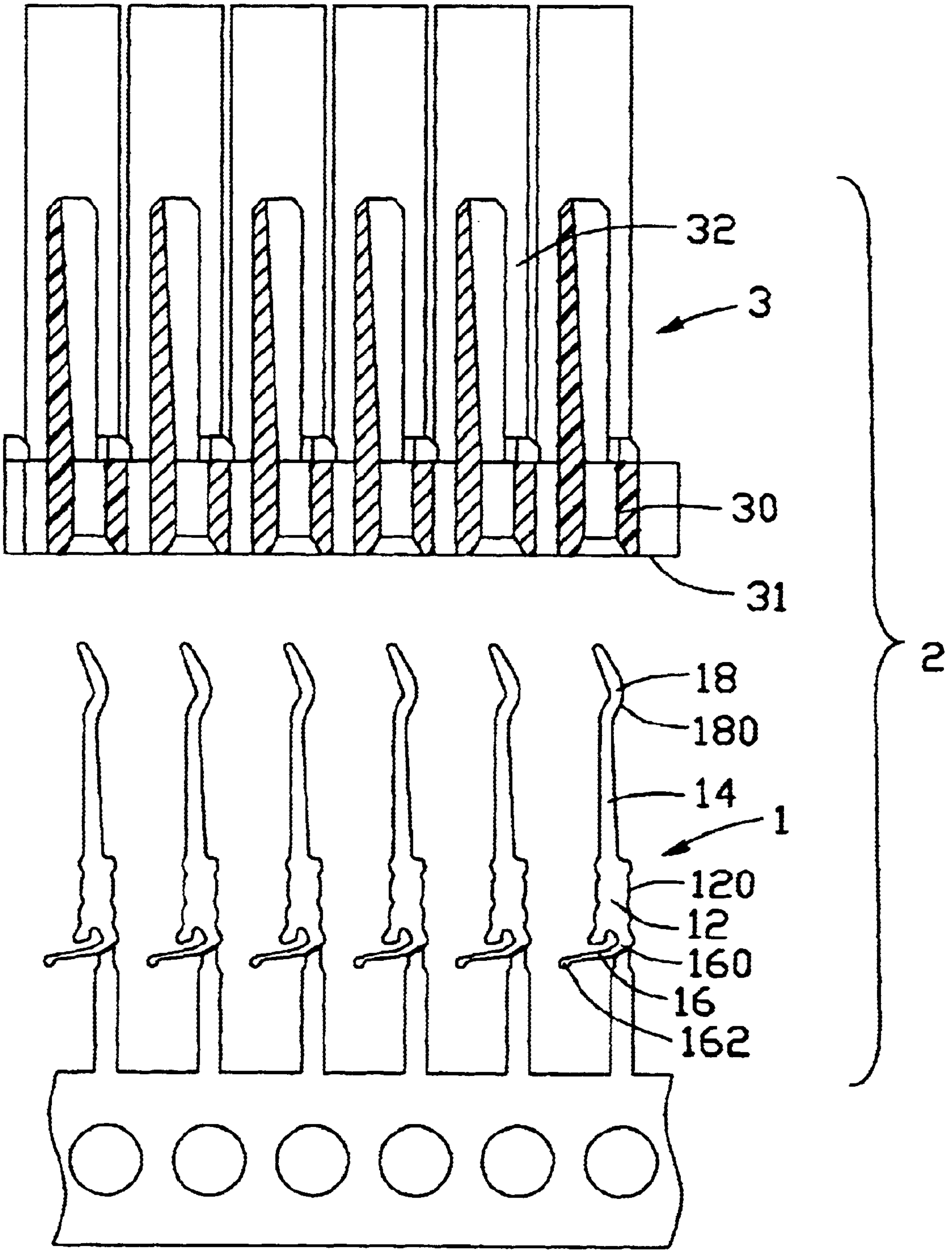
FIG. 2 is a cross-sectional view of an insulative housing of an electrical connector to be assembled with the contact strip of FIG. 1.
Figure 4:
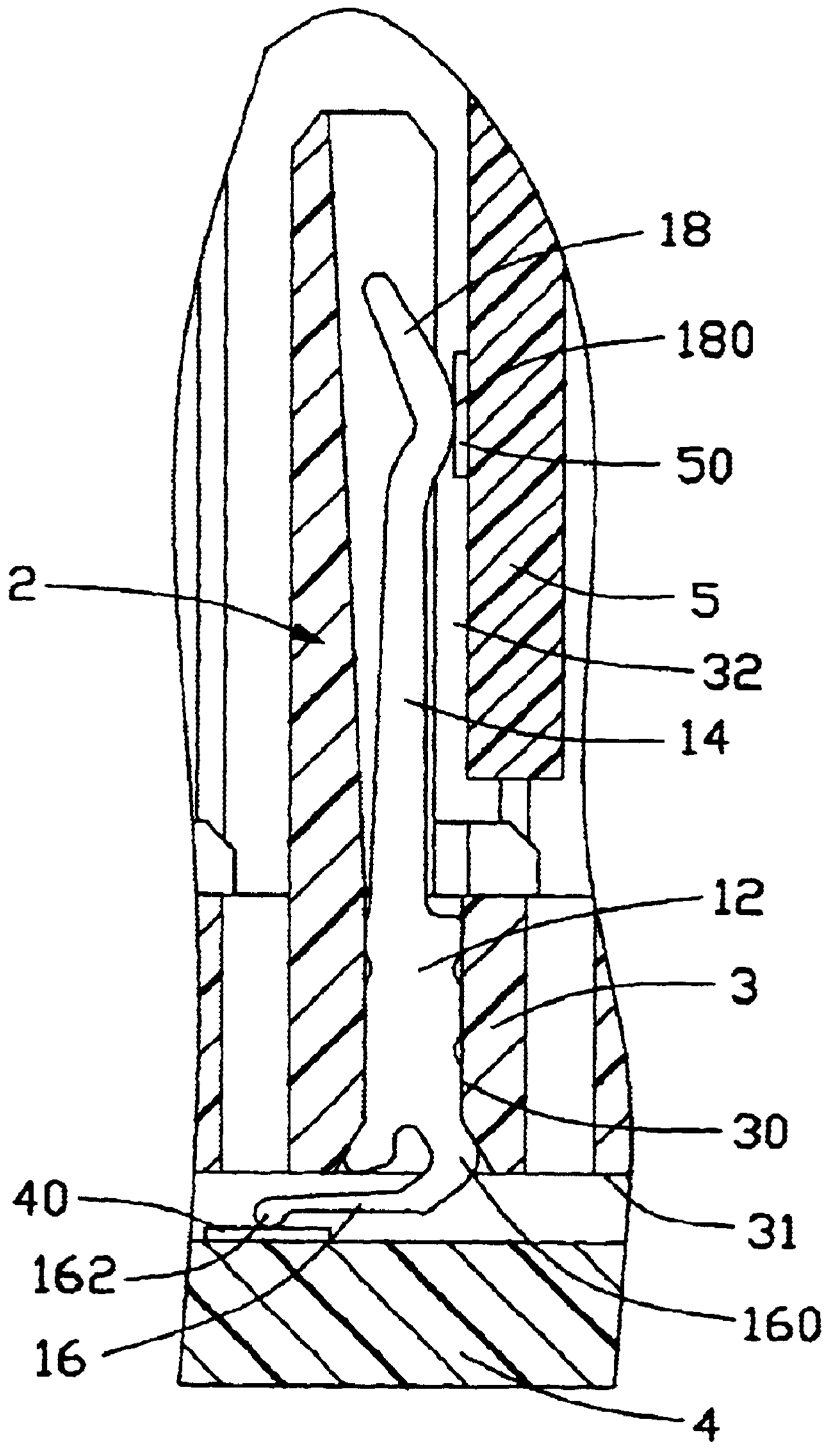
FIG. 4 is an enlarged view of a part of the assembly in FIG. 3 and a mother board and a daughter board that are electrically interconnected by the assembly.
Figure 5:
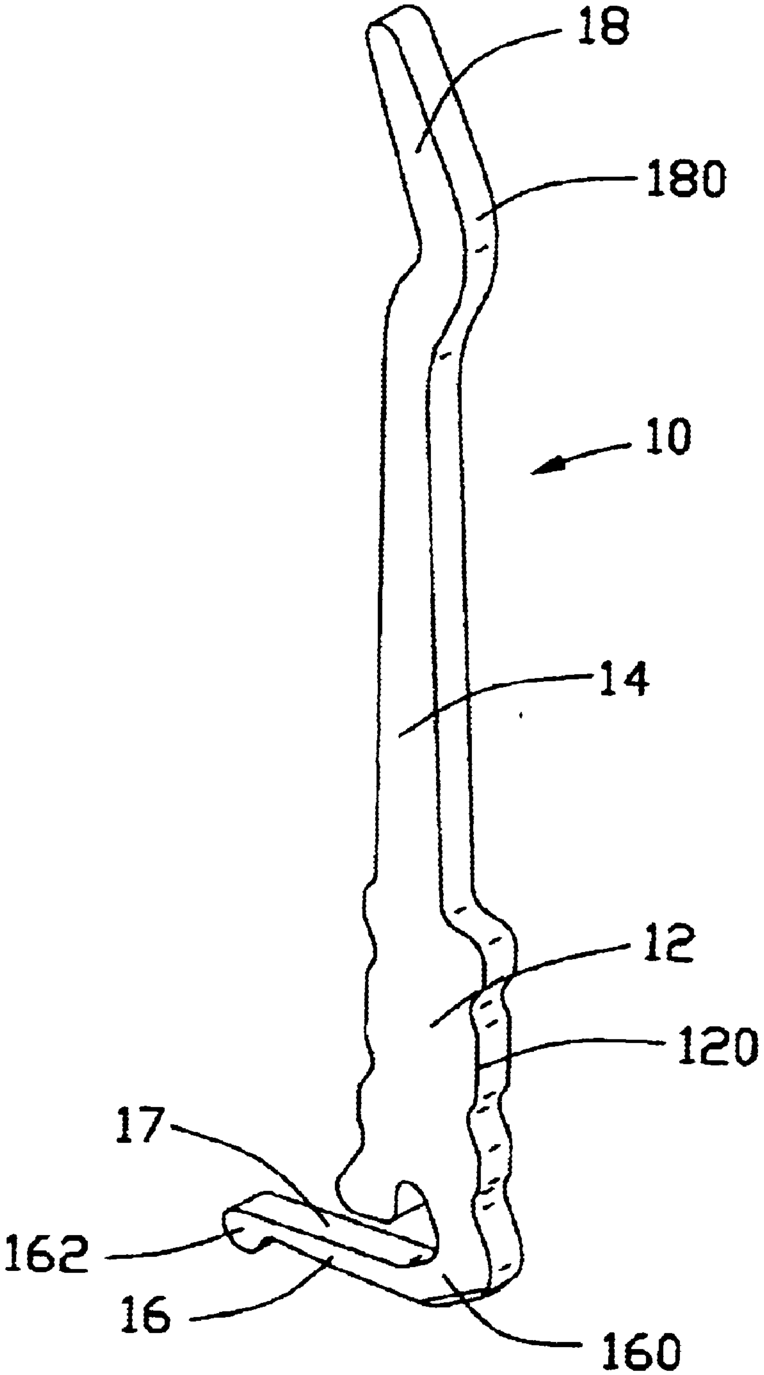
FIG. 5 is a perspective view of a contact in accordance with the present invention.

Referring to FIGS. 1, 2 and 5, the contact strip 1 includes a row of contacts 10 interconnected by a carrier 60. The carrier 60 defines a row of round holes (not labeled) therein for engaging with a driving wheel whereby the carrier 60 can be moved by the driving wheel in a continuous stamping process. Referring to FIG. 5 in conjunction with FIG. 1, each contact 10 includes a body portion 12 with a plurality of serrations 120 at opposite side edges thereof, and upper and lower arms 14, 16 upwardly and downwardly extending from upper and lower ends of the body portion 12, respectively. The lower arm 16 also extends laterally from the lower end of the body portion 12 to thereby have a generally perpendicular relationship with the upper arm 14. The lower arm 16 has a curved connecting portion 160 connecting with and offsetting from the lower end of the body portion 12, and a free end 162 for electrically connecting to a mother board 4 (FIG. 4). The curved connecting portion 160 provides a spring feature to the lower arm 16. A space 17 is defined between the body portion 12 and the lower arm 16 so that the free end 162 of the lower arm 16 can resiliently engage with a circuit trace 40 (FIG. 4) on the mother board 4. The upper arm 14 has a top free end 18 which has a curved edge 180 facing in a direction from the free end 162 toward the curved connecting portion 160 of the lower arm 16.

The contacts 10 are connected together by a plurality of connection stems 62 of the carrier 60. Each connection stem 62 extends from a lower part of the curved connecting portion 160 of the lower arm 16 in a direction away from the upper arm 14. An oblique score 15, which is also known as V-cut in this art, is defined in a joint at which the curved connecting portion 160 and the connection stem 62 are joined. The oblique score 15 substantially extends in a tangential direction of a lower curved contour of the curved connecting portion 160. In the preferred embodiment of the present invention, the oblique score 15 has an angle generally of 45 degrees with respect to an extending direction of the connection stem 62.

Figure 3:
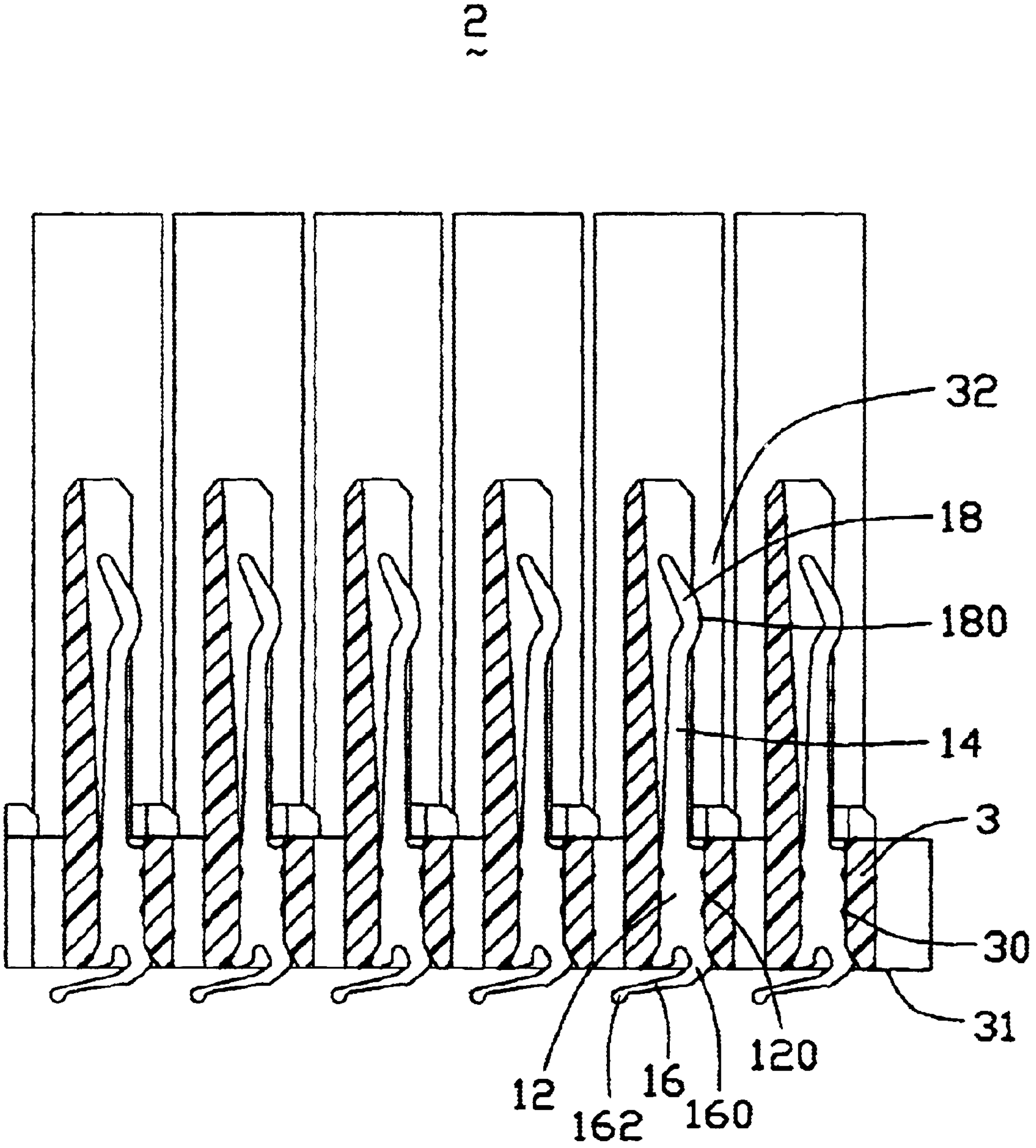
FIG. 3 is an assembled view of FIG. 2 with a contact carrier of the strip is removed therefrom.

FIGS. 2 and 3 show the contacts 10 assembled to a dielectric housing 3 of an electrical connector 2, which is used for interconnecting a daughter board 5 and the mother board 4 in a mutually perpendicular relation. The dielectric housing 3 defines a plurality of cavities 30 through a bottom face 31 thereof, and a plurality of board slots 32 above the cavities 30 for receiving an edge of the daughter board 5 therein. The contacts 10 are simultaneously assembled to the housing 3 by gripping and pushing the carrier 60 in a bottom-to-up direction until the serrations 120 of the body portions 12 interferentially engage with the housing 3 in the cavities 30. At the same time, the curved edges 180 of the upper arms 14 project into corresponding board slots 32 of the housing 3. The lower arm 16 is disposed below the bottom face 31 of the housing 3. Subsequently, the contacts 10 can be easily separated from the carrier 60 by bending the connection stems 62 of the carrier 60 along the oblique scores 15. Thus, the contacts 10 are securely received in the housing 3 of the electrical connector 2.

Referring to FIG. 4, the free end 162 of the lower arm 16 resiliently contacts with the circuit trace 40 of the mother board 4 when the electrical connector 2 is pressed onto the mother board 4. The curved edge 180 of the upper arm 18 engages with a circuit trace 50 of the daughter board 5 when the daughter board 5 is inserted into the board slot 32 of the housing 3. Hence, an electrical transmitting path is established between the mother board 4 and the daughter board 5.

It can be noted that because the score 15 is disposed in the joint at which the curved connecting portion 160 and the connection stem 62 are joined and substantially extends in the tangential direction of the curved connecting portion 160, the contact 10 has no remnant left on the lower arm 16 when it is separated from the carrier 60, thereby ensuring the flexibility of the lower arm 16. Thus, the contact 10 has a good resilient engagement with the mother board 4 when the connector 2 is pressed onto the mother board 4.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A contact strip having a plurality of contacts interconnected by a carrier, each contact includes a body portion for being fixedly retained to a dielectric housing, an upper arm upwardly extending from the body portion for engaging with a first printed circuit board and a lower arm extending downwardly and laterally from the body portion, said lower arm having a free end for resiliently engaging with a second printed circuit board and a connecting portion connecting with the body portion, said carrier defining a row of holes therein and having a plurality of connection stems each connecting with the connecting portion of a corresponding contact, an oblique score being defined between the connecting portion of each contact and a corresponding connection stem of the carrier for facilitating removing the carrier from the contacts wherein the oblique score extends substantially along a tangential direction of a curved contour of the connecting portion of the lower arm;

wherein the oblique score is angled substantially by 45 degrees with respect to an extending direction of the corresponding connection stem; and wherein the connection stems of the carrier are substantially parallel to the upper arms of the contacts.

2. The contact strip as claimed in claim 1, wherein the upper arm of the each contact has a top free end with a curved edge for engaging with the first printed circuit board.

3. The contact strip as claimed in claim 1, wherein the body portion forms a plurality of serrations at opposite side edges thereof for engaging with the dielectric housing.

* * * * *